(12) United States Patent
Govindu et al.

(10) Patent No.: US 7,368,979 B2
(45) Date of Patent: May 6, 2008

(54) IMPLEMENTATION OF OUTPUT FLOATING SCHEME FOR HV CHARGE PUMPS

(75) Inventors: Prashanti Govindu, Santa Clara, CA (US); Feng Pan, Fremont, CA (US); Man Mui, Santa Clara, CA (US); Gyuwan Kwon, Cupertino, CA (US); Trung Pham, Fremont, CA (US); Chi-Ming Wang, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 51 days.

(21) Appl. No.: 11/523,875

(22) Filed: Sep. 19, 2006

(65) Prior Publication Data

US 2008/0068067 A1  Mar. 20, 2008

(51) Int. Cl.
*G05F 1/10* (2006.01)
(52) U.S. Cl. ..................................................... 327/536
(58) Field of Classification Search ................. 327/535, 327/536, 537
See application file for complete search history.

(56) References Cited

U.S. PATENT DOCUMENTS

| | | | |
|---|---|---|---|
| 5,029,282 A | 7/1991 | Ito | |
| 5,053,640 A | 10/1991 | Yum | |
| 5,373,477 A | 12/1994 | Sugibayashi | |
| 5,596,532 A | 1/1997 | Cernea et al. | |
| 5,625,544 A | 4/1997 | Kowshik et al. | |
| 5,631,547 A | 5/1997 | Fujioka et al. | |
| 5,796,296 A | 8/1998 | Krzentz | |
| 5,883,501 A | 3/1999 | Arakawa | |
| 5,946,258 A | 8/1999 | Evertt et al. | |
| 5,978,283 A | 11/1999 | Hsu et al. | |
| 6,091,282 A | 7/2000 | Kim | |
| 6,259,612 B1 | 7/2001 | Itoh | |
| 6,297,687 B1 | 10/2001 | Sugimura | |
| 6,320,797 B1 | 11/2001 | Liu | |
| 6,404,274 B1 | 6/2002 | Hosono et al. | |
| 6,424,570 B1 | 7/2002 | Le et al. | |
| 6,434,044 B1 | 8/2002 | Gongwer et al. | |
| 6,456,155 B2 | 9/2002 | Takai | |
| 6,459,328 B1 | 10/2002 | Sato | |
| 6,529,437 B2 | 3/2003 | Kono | |
| 6,549,064 B2 | 4/2003 | Bandy et al. | |
| 6,577,535 B2 | 6/2003 | Pasternak | |

(Continued)

FOREIGN PATENT DOCUMENTS

WO    WO 99/49576    9/1999

*Primary Examiner*—Jeffrey Zweizig
(74) *Attorney, Agent, or Firm*—Beyer Law Group LLP

(57) ABSTRACT

According to different embodiments of the present invention, various methods, devices and systems are described for managing power in charge pumps in a non-volatile memory system having a high voltage charge pump and associated regulator. A method includes the following operations, receiving an operation command corresponding to an operation, pumping up a charge pump output voltage to a desired output voltage, turning off the regulator and the charge pump when the output voltage is approximately the desired output voltage compensating for charge sharing by turning on the charge pump and setting a pump clock rate to a slow clock rate in order to avoid overshooting the desired output voltage by the charge pump while the operation is being carried out, and compensating for junction leakage by turning on the regulator and the charge pump until the charge pump output voltage is the desired output voltage.

19 Claims, 4 Drawing Sheets

U.S. PATENT DOCUMENTS

| | | |
|---|---|---|
| 6,605,986 B2 | 8/2003 | Tanzawa et al. |
| 6,661,682 B2 | 12/2003 | Kim et al. |
| 6,760,262 B2 | 7/2004 | Haeberli et al. |
| 6,841,981 B2 | 1/2005 | Smith et al. |
| 6,922,096 B2 | 7/2005 | Cernea |
| 6,922,098 B2 | 7/2005 | Choi et al. |
| 7,120,058 B2 | 10/2006 | Seo et al. |
| 7,304,871 B2 * | 12/2007 | Ito et al. ............ 363/59 |
| 2002/0089317 A1 | 7/2002 | Khouri et al. |
| 2006/0125451 A1 | 6/2006 | Tabaian et al. |
| 2006/0267673 A1 | 11/2006 | Gan et al. |
| 2007/0030749 A1 | 2/2007 | Pyeon et al. |

* cited by examiner

IMPLEMENTATION OF OUTPUT FLOATING SCHEME FOR HV CHARGE PUMPS

FIELD OF THE INVENTION

The present invention relates generally to non-volatile memory devices. More particularly, the present invention relates to a method for managing power consumption by high voltage charge pumps used in FLASH memory devices.

BACKGROUND

Memory cards are commonly used to store digital data for use with various products (e.g., electronics products). Examples of memory cards are flash cards that use Flash type or EEPROM type memory cells (also referred to as FLASH memory cells) to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif. Unlike standard MOS transistors, FLASH memory cells contain a floating gate that is electrically isolated and located between a control gate and a typically p-type substrate. Programming, i.e. injecting electrons into the floating gate, is generally accomplished by means of three major mechanisms:

Fowler-Nordheim (FN) tunneling, source side injection (SSI) and channel hot-electron injection (CHEI). During programming with FN tunneling, a high positive bias, called the program voltage ($V_{pgm}$), is applied to the control gate of a selected memory cell by biasing the appropriate word line while the associated bit line is held at about 0V whereas unselected bit lines are pre-charged to a high voltage, Vdd. Electrons tunnel from the substrate through the thin gate oxide and are then collected in the floating gate where they become trapped by the surrounding dielectric. In this way, the floating gate acquires a negative charge thereby raising the threshold voltage to a positive value and programming the cell to logic 0. Other operations that require high voltages include erase and program verify operations.

In order to provide the requisite high voltages for these operations (i.e., programming, erase, verify, etc.) a number of high voltage charge pumps provide the requisite voltages. However, with currently available high voltage charge pump designs, efficiencies are typically low, in the range of approximately 5% to 10% which means that the charge pump itself must use, for example, 10 mA of current in order to deliver 100 uA of current to an output node. In order to provide the requisite output voltage when connected to a load, a voltage regulator circuit coupled to the charge pump provides a constant DC current adding to the already relatively high current demand for conventional charge pump arrangements. This high current demand adds substantially to the overall power requirements of the memory device. For example, during program verify charge pumps used for programming are in regulation and burn power even though their respective outputs are not connected to their associated loads whereas during programming, the charge pumps used to program are in constant regulation after the desired voltage levels have been achieved. In any case, these additional current requirements unnecessarily add to the overall power consumption of the device and are therefore wasteful and costly.

Therefore, what is desired is a method, system, and apparatus for managing current used by high voltage charge pumps and associated regulators in a FLASH memory device.

SUMMARY OF THE INVENTION

According to different embodiments of the present invention, various methods, devices and systems are described for managing power in a non-volatile memory system having a high voltage charge pump and associated regulator. A method of managing power in a non-volatile memory system having a high voltage charge pump and associated regulator is described. The method includes the following operations, receiving an operation command corresponding to an operation, pumping up a charge pump output voltage to a desired output voltage consistent with the received operation command, turning off the regulator and the charge pump when the output voltage is approximately the desired output voltage compensating for charge sharing by turning on the charge pump and setting a pump clock rate to a slow clock rate in order to avoid overshooting the desired output voltage by the charge pump while the operation is being carried out, and compensating for junction leakage by turning on the regulator and the charge pump until the charge pump output voltage is the desired output voltage.

According to specific embodiments, a charge pump circuit used to provide the voltages and currents to a flash memory cell is described that includes a charge pump used to convert an input voltage (Vin) to a desired output voltage (Vout) at a charge pump output node that is higher than the input voltage Vin, a regulator circuit that regulates the output of the charge pump so that the output voltage Vout remains at a substantially constant voltage level, a load_connect_enable signal generator that provides a load_connect_enable signal to a switch 218, wherein when the load_enable_connect signal goes LOW, the switch "opens" thereby electrically disconnecting the charge pump output node from a load causing the charge pump output node to float, and wherein when the load_connect_enable signal goes HIGH, then the switch circuit "closes" so as to electrically connect the charge pump output node to the load, a FLAG signal generator unit coupled to the regulator that generates and issues to the charge pump by a FLAG signal having a rising and a falling edge, a FLAG_ASSIST signal generator unit connected to the charge pump that generates a FLAG_ASSIST signal having a FLAG_ASSIST rising and falling edge, and an edge detector unit in communication with the FLAG signal generator and the FLAG_ASSIST signal generator wherein the edge detector latches the first falling edge of the FLAG signal immediately after the load_connect_enable signal is HIGH goes HIGH and in response, the FLAG_ASSIST signal generator unit generates a FLAG_ASSIST signal having a FLAG_ASSIST rising and falling edge that is used in conjunction with the FLAS signal to turn off the regulator and the charge pump and in some cases to set the pump clock to a very slow clock rate.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENTS

Figure 1:
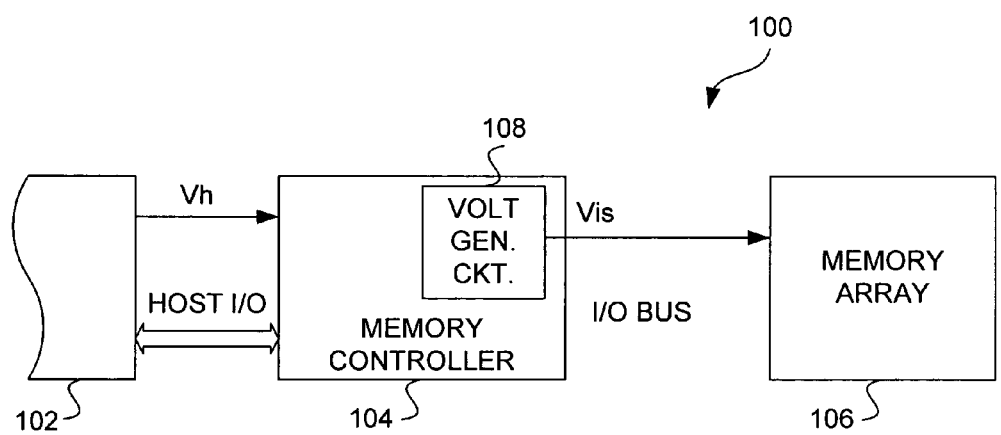
FIG. 1 shows a computer system that includes a central processing unit (CPU) that is coupled to one or more flash memory devices, such as flash memory device over a computer bus.

Reference will now be made in detail to a particular embodiment of the invention an example of which is illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

The invention provides for managing the overall power consumption of charge pumps in a non-volatile memory device. In the described embodiment, after a load is connected to a charge pump in regulation, both the charge pump and the regulator are turned off. In particular, when the charge pump has achieved a desired output voltage level ($V_{pgm}$, for example) and is in regulation (i.e., the associated regulator is providing the requisite DC current to maintain the desired output voltage), and a load is connected to an output node of the charge pump both the charge pump and the regulator are turned off such that the output node of the charge pump is floating. In order to compensate for charge sharing between the charge pump and the regulator, the charge pump is turned on for a predetermined length of time while the regulator is turned off. In order to prevent overshooting of the desired output voltage by the charge pump, the charge pump clock is set to a very slow clock rate on the order of 400 ns after which the charge pump clock is reset to the normal clock rate, which is typically 50 ns. In order to compensate for junction leakage, the regulator is turned on followed some time later by the charge pump turning on to compensate for an output voltage droop (approximately 100-200 mV) caused, in part, by the regulator being turned on. In this way, the charge pump pumps the output voltage back to the desired output voltage after which both the charge pump and the regulator are turned off. Whenever the charge pump output node is floating, both the charge pump and regulator are turned off.

For example in a particular implementation in order to compensate for charge sharing the pump is turned on for a predetermined period of time (such as 400 ns, 800 ns, or 1600 ns) using a very slow clock (such as 400 ns) directed by self-controlled logic that detects the falling edge of a FLG signal and generates signals which turn off the pump and the limiter and then changes the pump clock to 400 ns and then turns the pump on again. It should be noted that the charge loss due to charge sharing depends on how big the pump load capacitor is compared to the capacitor associated with the limiter or regulator, in any case, the charge loss is usually just a few hundred milli-volts (200 mV) or less. Based on this, it can be determined the length of time that the pump needs to be on and how slow the associated pump clock should be. The advantage of using a very slow clock is that the risk of overshoot is essentially eliminated during the time that the limiter is not on. In other words, as soon as the FLG goes low, the pump and the limiter are turned off. In order to compensate for charge sharing, the pump only is turned on briefly (either 6 us or 12 us, for example based on pre-calculated junction leakage values) and since the limiter is not turned on during this period of time, any risk of overshoot is eliminated by setting the pump clock to a very slow value (such as 400 ns). Once the limiter is on, however, and DC current flows through it and the FLG goes high and turns the pump on. It is important to note that the pump is not turned on during these intervals and only the limiter is turned on such that as soon as the limiter burns a certain amount of dc current (causing the FLG to go high) the pump turns on since if the pump was turned on at regular intervals there is a possibility of overshoot.

The invention will now be described in terms of an exemplary non-volatile memory device that takes the form of a FLASH memory device. It should be noted however that the invention can be used in any application for which managing a high voltage charge pump is appropriate.

FIG. 1 is a block diagram of a memory system 100 according to one embodiment of the invention. The memory system 100 is, for example, associated with a memory card (such as a plug-in card), a memory stick, or some other data storage product. Examples of a memory card include PC Card (formerly PCMCIA device), Flash Card, Flash Disk, Multimedia Card, and ATA Card. The memory system 100 can also be referred to as a memory product or a removable data storage product.

The memory system 100 cooperates with a host 102. For example, the host 102 can be a computing device, such as a personal computer. In particular, the memory system 100 stores data that can be utilized by the host 102. The memory system 100 and the host 102 can communicate over a host Input/Output (I/O) bus.

The host 102 provides a host voltage ($V_H$) (i.e., supply voltage) to the memory system 100. The memory controller 104 couples to the host I/O bus and the host voltage ($V_H$). The memory controller 104 couples to a memory array 106 using an I/O bus and an internal supply voltage ($V_{IS}$). The internal supply voltage ($V_{IS}$) is generated by a voltage generation circuit 108 provided within the memory controller 104. The voltage generation circuit 108 can correspond to any of the voltage generation circuits discussed herein. For example, the voltage generation circuit 108 can correspond to the voltage generation circuits illustrated in FIG. 2.

The level of the voltages can vary with implementation. As one example, the host voltage ($V_H$) might be 3.3 or 1.8 volts, and the level of the internal supply voltage ($V_{IS}$) might be 6.5 volts, 15 volts or 30 volts. Moreover, although the voltage generation circuit 108 is illustrated being internal to the memory controller 104, in alternative embodiment, the voltage generation circuit 108 can be (i) internal to the memory array 106 or (ii) separate from either the memory controller 104 or the memory array 106.

The memory array 106 provides an array of data storage elements that provide non-volatile digital data storage. In one embodiment, the data storage elements are electrically programmable and electrically erasable, such as EEPROM or FLASH devices. For example, the data storage elements can be based on floating-gate devices. The memory array 106 can include one or more semiconductor dies, chips or products. The memory array 106 can include data storage elements. The memory controller 104 is also often a separate semiconductor die, chip or product.

Figure 2:
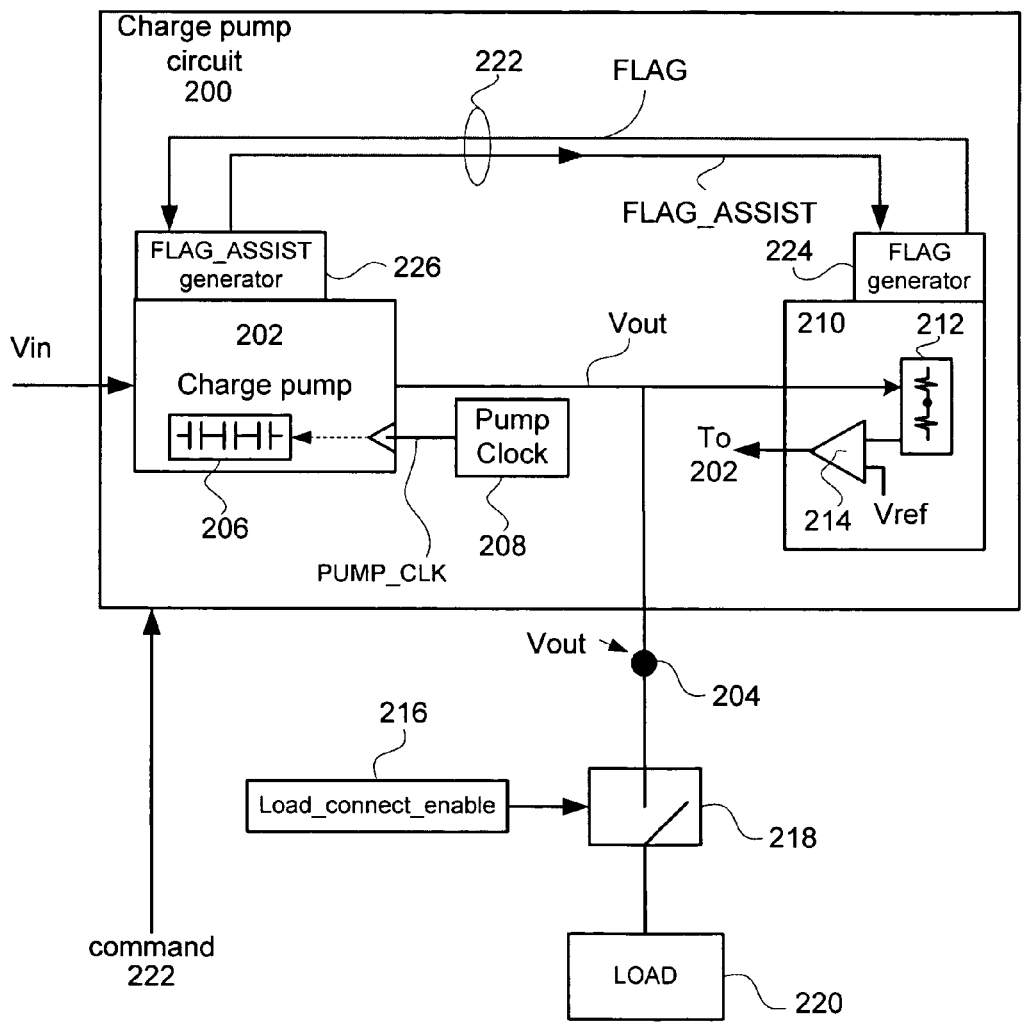
FIG. 2 illustrates further details of the charge pump circuit used to provide the voltages and currents to each flash memory cell in accordance with an embodiment of the invention.

FIG. 2 illustrates further details of a charge pump circuit 200 used to provide the voltages and currents to the flash memory cell. It should be noted that although only a single charge pump 202 is shown for simplicity there can be any number of charge pumps each of which can be used for a particular operation (PROGRAM, ERASE, READ, etc.). The charge pump circuit 200 includes a charge pump 202 used to convert an input voltage Vin (such as 1.8 volts) to an output voltage (Vout) at a charge pump output node 204 that is higher than the input voltage Vin. The charge pump 202 includes a series of capacitors 206 driven by a clock signal PUMP_CLK generated by a pump clock circuit 208. The higher level voltage generated by the charge pump 202 is regulated by a regulator circuit 210 that regulates the output of the charge pump 202. The regulator circuit 210 includes a resistor divider 212 that divides the output voltage Vout using a number of resistors and a comparator 214 that couples to the resistor divider 212 and a reference voltage ($V_{REF}$). The output of the comparator 214 is fed back to the charge pump 202 so that the charge pump 202 can regulate the output voltage Vout so that it remains at a substantially constant voltage level. Therefore, even in those circumstances when the regulator 210 is turned off, the resistor divider 212 provides a path for which charge can be depleted from the capacitors 206 in the charge pump 202 (referred to as charge sharing) and thereby reduce the output voltage Vout from a desired voltage level.

Figure 3:
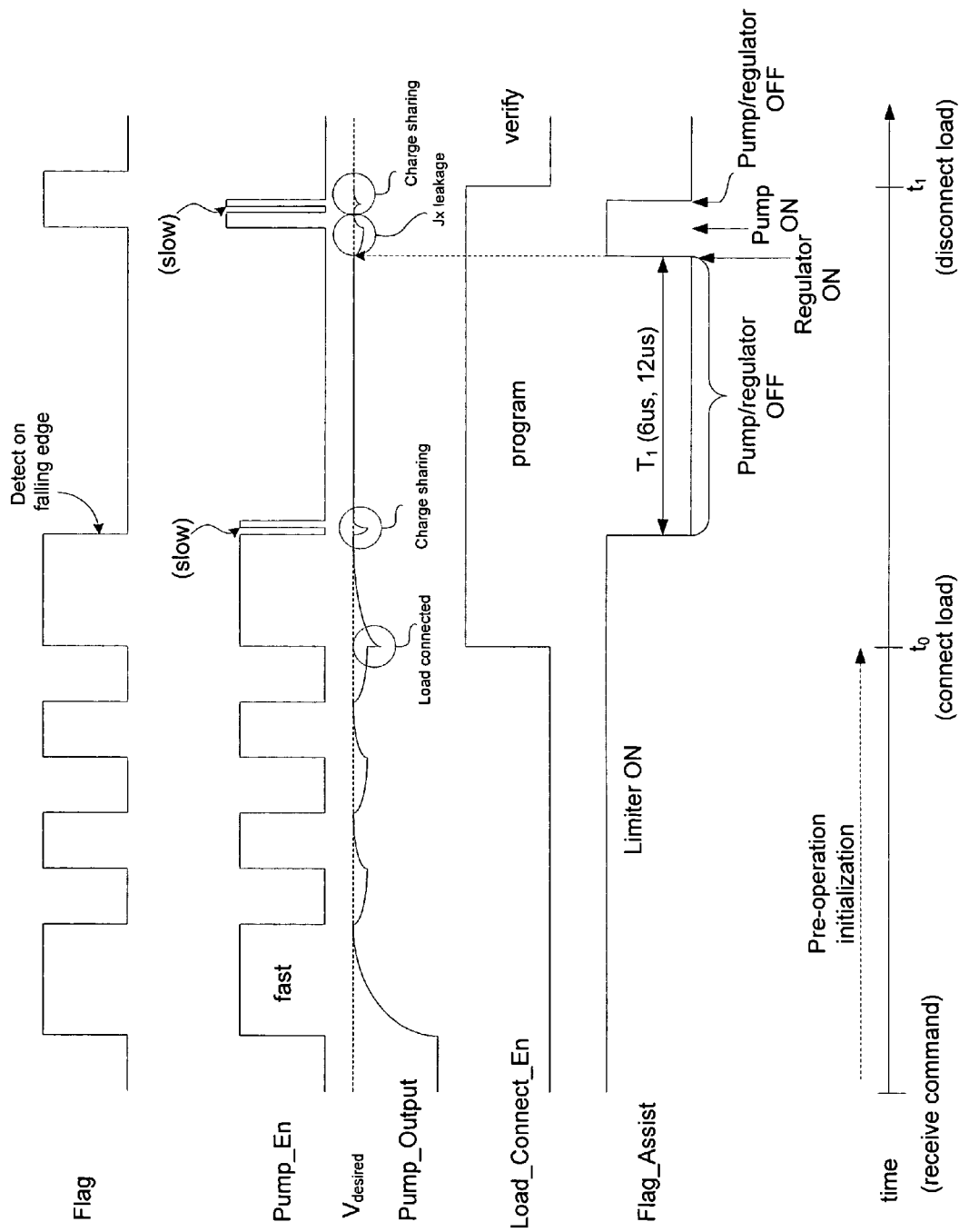
FIG. 3 shows a FLAG signal, a PUMP_ENABLE signal, a PUMP_OUTPUT signal, a LOAD_CONNECT_ENABLE signal and a FLAG_ASSIST signal in accordance with an embodiment of the invention.

In the described embodiment, a load_connect_enable signal generator 216 provides a load_connect_enable signal to a switch 218. As shown in FIG. 3, when the load_enable_connect signal goes LOW, the switch 218 "opens" thereby electrically disconnecting the charge pump output node 204 from a load 220 causing the charge pump output node 204 to float. Alternatively, when the load_connect_enable signal goes HIGH, then the switch circuit 218 "closes" so as to electrically connect the charge pump output node 204 to the load 220.

In the described embodiment and referring to FIGS. 2 and 3, when a command signal 222 to begin an operation (such as PROGRAM, ERASE, or READ) is issued, the charge pump 202 pumps up at a fast clock rate (such as 50 ns) the incoming voltage Vin until a desired output voltage Vout is reached (i.e., approximately 25 volts for a programming, etc.) at which point the charge pump 210 goes into regulation (i.e., the regulator 210 provides feedback to the charge pump 202 that responds by turning on an off thereby maintaining the desired output voltage Vout). It should be noted that until the load_connect_signal goes HIGH, the switch 218 is "open" thereby electrically isolating the load 220 from the charge pump output node 204 (i.e., as above, the output node 204 is floating). When the load_connect signal does go HIGH, the switch 218 "closes" and the load 220 is connected to the charge pump output node 204 causing a slight drop in output voltage Vout that is compensated for by the charge pump 202 based upon feedback provided by the regulator 210.

Once the desired output voltage Vout has been reached with the load 220 connected (i.e., load_connect_enable is HIGH), an edge detector unit 222 detects and latches a first falling edge of a FLAG signal generated and issued to the charge pump 202 by a FLAG signal generator 224 (connected to the regulator 210). In response to the detection of the first falling edge of the FLAG signal after the load is connected, a FLAG_ASSIST signal generator unit 226 connected to the charge pump generates a FLAG_ASSIST signal having a FLAG_ASSIST rising and falling edge. As described in more detail below, the FLAG signal is used to turn off the charge pump 202, the FLAG_ASSIST signal is used to turn off the regulator 210 and in some cases to set the pump clock to a very slow clock rate, on the order of 400 ns.

In the described embodiment, the first falling edge of the FLAG signal after the load 220 is connected is used to turn off the charge pump 202 and the regulator 210. Even though both the charge pump 202 and the regulator 210 are both turned off, there is sufficient charge depletion of the capacitors 206 to adversely affect the output voltage level Vout (by drooping of approximately 100-200 mv) due to what was referred to earlier as charge sharing between the charge pump output node 204 and the capacitances associated with the resistor divider 212. Therefore, in order to restore the charge pump output voltage Vout to the desired output voltage, the charge pump 202 is turned on for a predetermined period of time (on the order of 200-800 ns) without turning on the regulator 210. Since the regulator 210 is turned off, there is a possibility of overshooting the desired output voltage Vout by the charge pump 202. Therefore, in order to prevent such an overshoot from occurring, the pump clock 208 is set to generate a very slow clock pulse (400 ns, for example) that prevents overshoot of Vout during the period of time that the charge pump 202 is on and the regulator 210 is off. After the output voltage is restored, the charge pump is again turned off and the pump clock is reset to normal (50 ns). In addition to the voltage droop caused by charge sharing, various junction leakage effects must be compensated and in order to compensate for junction leakages, the regulator 210 is turned on followed some time later (depending upon the particular delay in turning on a particular charge pump) by the charge pump 204 for pre-determined period of time. This procedure is repeated until such time as the load is disconnected from the charge pump output node 204 at which point the charge pump 204 and the regulator 210 are both disabled. In this way, the overall current usage of the charge pump is substantially reduced over conventional arrangements.

Figure 4:
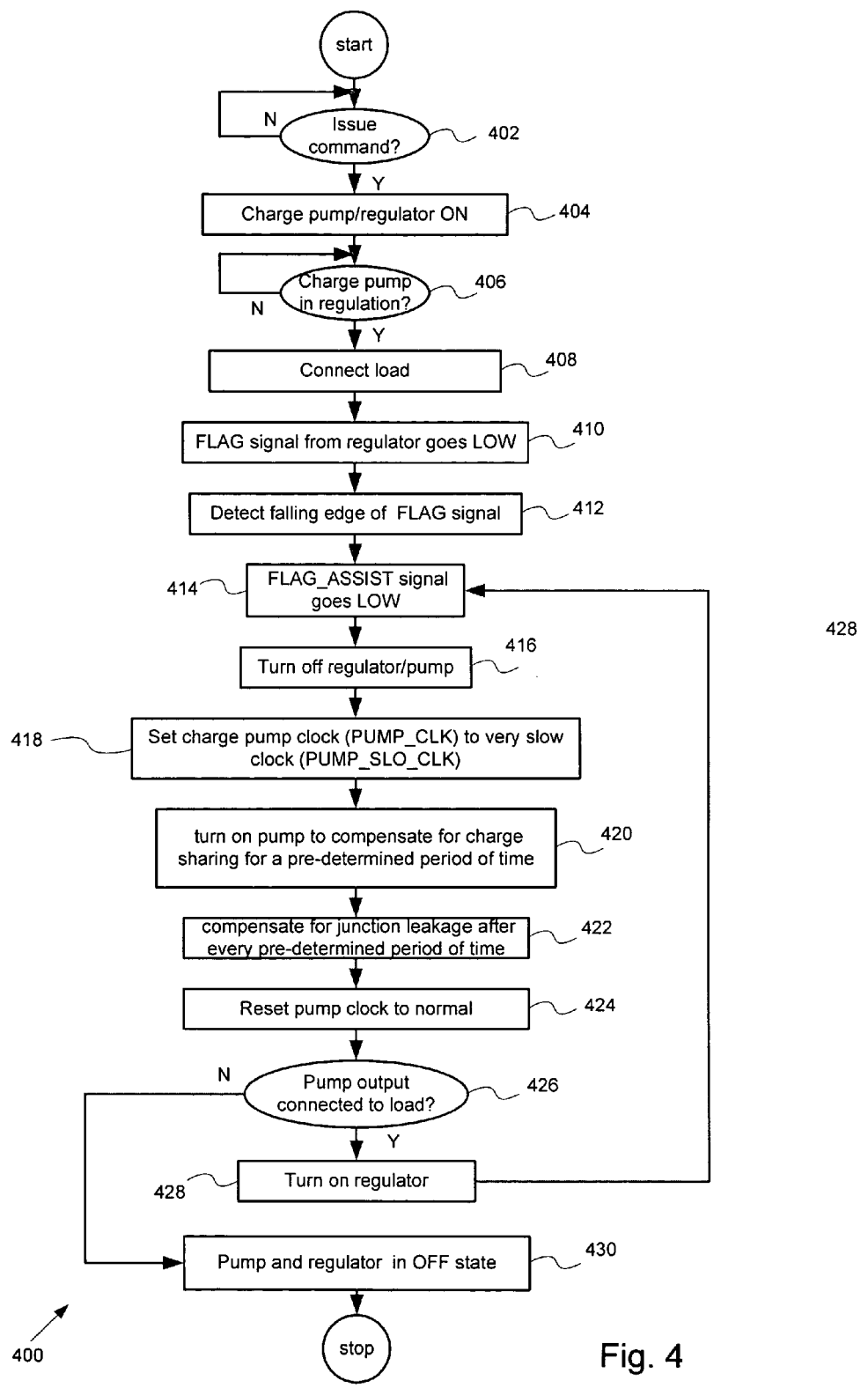
FIG. 4 shows a flowchart detailing a process in accordance with an embodiment of the invention.

FIG. 4 shows a flowchart detailing a process 400 in accordance with an embodiment of the invention. The process 400 begins at 402 whereupon the issuance of an operational command (PROGRAM, READ, ERASE, etc.) the charge pump(s) and regulator(s) are enabled at 404 whereupon the charge pump(s) pumps up an output voltage at a charge pump output node until a desired voltage is reached ($V_{pgm}$, $V_{pass}$, $V_{era}$, etc.). When the desired output voltage is reached, then the charge pump(s) is in regulation at 406. At 408, a load is connected to the output node of the charge pump and at 410 a FLAG signal generated by the regulator goes LOW the falling edge of which is detected at 412 whereupon a FLAG_ASSIST signal goes LOW at 414. When a falling edge of the FLAG_ASSIST signal is detected, the regulator and the pump are turned OFF at 416. At 418, the pump clock that is normally around 50 ns (PUMP_CLK) is set to a very slow pump clock rate (SLO_PUMP_CLK) on the order of 400 ns. At 420, charge sharing is compensated by turning on the charge pump without turning on the regulator for a pre-determined period of time. At 422, junction leakage is compensated for after every pre-determined period of time while at 424, the pump clock is reset to normal and if, at 426 it is determined that the charge pump output node is connected to the load, then at 428 the regulator is turned on (which causes the regulator flag to go low that, in turn, causes the pump to turn on), otherwise at 430 and the charge pump and regulator are in an OFF state.

The invention can further pertain to an electronic system that includes a memory system as discussed above. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products that acquire data, such as cameras, hand-held or notebook computers, network cards, network appliances, set-top boxes, hand-held or other small media (e.g., audio) players/recorders (e.g., MP3 devices), and medical monitors.

The advantages of the invention are numerous. Different embodiments or implementations may yield one or more of the following advantages. One advantage of the invention is that voltage regulation for charge pumps can be provided in a power efficient manner. Another advantage of the invention is that regulation of an output voltage level can be temporarily disabled when current being drawn is low. Still another advantage of the invention is that low power, reliable, high performance memory systems can be obtained.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

The invention claimed is:

1. A method of managing power in a non-volatile memory system having a high voltage charge pump and associated regulator, comprising:
   receiving an operation command corresponding to an operation;
   pumping up a charge pump output voltage to a desired output voltage consistent with the received operation command;
   turning off the regulator and the charge pump when the output voltage is approximately the desired output voltage;
   compensating for charge sharing by turning on the charge pump and setting a pump clock rate to a slow clock rate in order to avoid overshooting the desired output voltage by the charge pump while the operation is being carried out; and
   compensating for junction leakage by turning on only the regulator until the charge pump output voltage is the desired output voltage.

2. A method as recited in claim 1, wherein the operational command is selected from a group that includes: PROGRAMMING, ERASE, and VERIFY.

3. A method as recited in claim 2, wherein the desired output voltage is selected from a group that includes; $V_{prgm}$, $V_{era}$, and $V_{pass}$, wherein $V_{prgm}$ is approximately 25 volts, $V_{erase}$ is approximately 15 volts, and $V_{pass}$ is approximately 10 volts.

4. A method as recited in claim 1, further comprising;
   generating a FLAG signal by the regulator having a FLAG signal rising edge and a FLAG signal falling edge;
   forwarding the FLAG signal to the charge pump by the regulator; and
   detecting a first FLAG signal falling edge immediately after the load is connected to the output node of the high voltage charge pump.

5. A method as recited in claim 4, comprising;
   generating a FLAG_ASSIST signal having a FLAG_ASSIST rising edge and FLAG_ASSIST falling edge by the charge pump based upon the detected first FLAG signal falling edge.

6. A method as recited in claim 5, wherein the turning OFF the regulator and the charge pump and the resetting a pump clock rate to a very slow pump clock rate is based upon detecting a first FLAG_ASSIST falling edge.

7. A method as recited in claim 6, wherein the compensating for charge sharing comprises:
   turning ON the charge pump only for a first period of time.

8. A method as recited in claim 7, during VERIFY operation, the charge pump output node is floating.

9. A method as recited in claim 1, wherein the slow clock rate is approximately 400 ns.

10. A charge pump circuit used to provide the voltages and currents to a flash memory cell, comprising;
    a charge pump used to convert an input voltage (Vin) to a desired output voltage (Vout) at a charge pump output node that is higher than the input voltage Vin;
    a regulator circuit that regulates the output of the charge pump so that the output voltage Vout remains at a substantially constant voltage level;
    a load_connect_enable signal generator that provides a load_connect_enable signal to a switch 218, wherein when the load_enable_connect signal goes LOW, the switch "opens" thereby electrically disconnecting the charge pump output node from a load causing the charge pump output node to float, and wherein when the load_connect_enable signal goes HIGH, then the switch circuit "closes" so as to electrically connect the charge pump output node to the load;
    a FLAG signal generator unit coupled to the regulator that generates and issues to the charge pump by a FLAG signal having a rising and a falling edge;
    a FLAG_ASSIST signal generator unit connected to the charge pump that generates a FLAG_ASSIST signal having a FLAG_ASSIST rising and falling edge; and
    an edge detector unit in communication with the FLAG signal generator and the FLAG_ASSIST signal generator wherein the edge detector latches the first falling edge of the FLAG signal immediately after the load_connect_enable signal is HIGH goes HIGH and in response, the FLAG_ASSIST signal generator unit generates a FLAG_ASSIST signal having a FLAG_ASSIST rising and falling edge that is used in conjunction with the FLAS signal to turn off the regulator and the charge pump and in some cases to set the pump clock to a very slow clock rate.

11. A computer program product for managing power in a non-volatile memory system having a high voltage charge pump and associated regulator executed by a computer processor, comprising:
    computer code for receiving an operation command corresponding to an operation;
    computer code for pumping up a charge pump output voltage to a desired output voltage consistent with the received operation command;

computer code for turning off the regulator and the charge pump when the output voltage is approximately the desired output voltage;

computer code for compensating for charge sharing by turning on the charge pump and setting a pump clock rate to a slow clock rate in order to avoid overshooting the desired output voltage by the charge pump while the operation is being carried out;

computer code for compensating for junction leakage by turning on the regulator and the charge pump until the charge pump output voltage is the desired output voltage; and computer readable medium for storing the computer code.

12. Computer program product as recited in claim 11, wherein the operational command is selected from a group that includes: PROGRAMMING, ERASE, and VERIFY.

13. Computer program product as recited in claim 12, wherein the desired output voltage is selected from a group that includes; $V_{prgm}$, $V_{era}$, and $V_{pass}$, wherein $V_{prgm}$ is approximately 25 volts, $V_{erase}$ is approximately 15 volts, and $V_{pass}$ is approximately 10 volts.

14. Computer program product as recited in claim 11, further comprising;

computer code for generating a FLAG signal by the regulator having a FLAG signal rising edge and a FLAG signal falling edge;

computer code for forwarding the FLAG signal to the charge pump by the regulator; and computer code for detecting a first FLAG signal falling edge immediately after the load is connected to the output node of the high voltage charge pump.

15. Computer program product as recited in claim 14, comprising;

computer code for generating a FLAG_ASSIST signal having a FLAG_ASSIST rising edge and FLAG_ASSIST falling edge by the charge pump based upon the detected first FLAG signal falling edge.

16. Computer program product as recited in claim 15, wherein the turning OFF the regulator and the charge pump and the resetting a pump clock rate to a very slow pump clock rate is based upon detecting a first FLAG_ASSIST falling edge.

17. Computer program product as recited in claim 16, wherein the compensating for charge sharing comprises:

turning ON the charge pump only for a first period of time.

18. Computer program product as recited in claim 17, during VERIFY operation, the charge pump output node is floating.

19. A method as recited in claim 11, wherein the slow clock rate is approximately 400 ns.

* * * * *